United States Patent
Liao et al.

(10) Patent No.: US 11,831,475 B1
(45) Date of Patent: Nov. 28, 2023

(54) RECEIVER USING PSEUDO PARTIAL RESPONSE MAXIMUM LIKELIHOOD SEQUENCE DETECTION

(71) Applicant: CREDO TECHNOLOGY GROUP LIMITED, Ugland House (KY)

(72) Inventors: Yu Liao, Longmont, CO (US); Junqing Phil Sun, Cupertino, CA (US); Haoli Qian, Fremont, CA (US)

(73) Assignee: Credo Technology Group Limited, Grand Cayman (KY)

( * ) Notice: Subject to any disclaimer, the term of this patent is extended or adjusted under 35 U.S.C. 154(b) by 0 days.

(21) Appl. No.: 17/806,450

(22) Filed: Jun. 10, 2022

(51) Int. Cl.
H04L 25/03 (2006.01)
H04L 1/00 (2006.01)
H03M 13/39 (2006.01)

(52) U.S. Cl.
CPC .. H04L 25/03178 (2013.01); H03M 13/3961 (2013.01); H04L 1/0054 (2013.01)

(58) Field of Classification Search
CPC ......... H04L 25/03019; H04L 25/03178; H04L 1/0058; H04L 1/0054; H03M 13/3961
USPC .......................... 375/232–233, 341, 262, 265
See application file for complete search history.

(56) References Cited

U.S. PATENT DOCUMENTS

| | | | | |
|---|---|---|---|---|
| 5,745,315 A | * | 4/1998 | Aoyama | G11B 5/09 |
| 6,385,239 B1 | * | 5/2002 | Okamoto | H04L 25/03038 |
| | | | | 375/232 |
| 6,625,235 B1 | * | 9/2003 | Coker | G11B 20/10175 |
| | | | | 375/350 |
| 6,690,739 B1 | * | 2/2004 | Mui | H04L 1/0054 |
| | | | | 375/348 |
| 2001/0005405 A1 | * | 6/2001 | Shimoda | H04L 7/0062 |
| | | | | 375/350 |
| 2004/0076245 A1 | * | 4/2004 | Okamoto | H04L 25/03261 |
| | | | | 375/341 |
| 2018/0167143 A1 | * | 6/2018 | Yao | H04B 10/524 |

(Continued)

FOREIGN PATENT DOCUMENTS

WO    WO-2021249650 A1 * 12/2021

OTHER PUBLICATIONS

U.S. Appl. No. 17/656,751 as filed in U.S. Patent and Trademark Office on Mar. 28, 2022 by Inventors Yu Liao and Junqing Sun, titled: "Reduced-Complexity Maximum Likelihood Sequence Detector Suitable for M-ary Signaling".

(Continued)

*Primary Examiner* — Emmanuel Bayard
(74) *Attorney, Agent, or Firm* — Ramey LLP; Daniel J. Krueger

(57) ABSTRACT

Receivers and receiving methods having maximum likelihood sequence detection with pseudo partial response equalization. One illustrative receiver includes: a feedforward equalizer that produces an equalized receive signal by diminishing a receive signal's intersymbol interference; a decision element that derives initial symbol decisions from samples of the equalized receive signal; and a filter that applies a partial response to the equalized receive signal or to an equalization error signal to produce input for a maximum likelihood sequence detector (MLSD). The MLSD may be a reduced complexity detector that derives a final sequence of symbol decisions by evaluating state metrics only for each initial symbol decision and its competing symbol decision.

19 Claims, 4 Drawing Sheets

(56) References Cited

U.S. PATENT DOCUMENTS

2021/0044462 A1\* 2/2021 Lu .................... H04L 25/061
2021/0306009 A1\* 9/2021 Riani ............... H04L 25/03171

OTHER PUBLICATIONS

Cioffi, J. M. Chapter 9: Decoding Algorithms. Hitachi Professor Emeritus of Engineering, Marconi Society Fellow, Department of Electrical Engineering, Stanford University. Published no later than Jan. 2021. Retrieved Aug. 25, 2022, from https://cioffi-group.stanford.edu/doc/book/chap9.pdf.

\* cited by examiner

FIG. 1
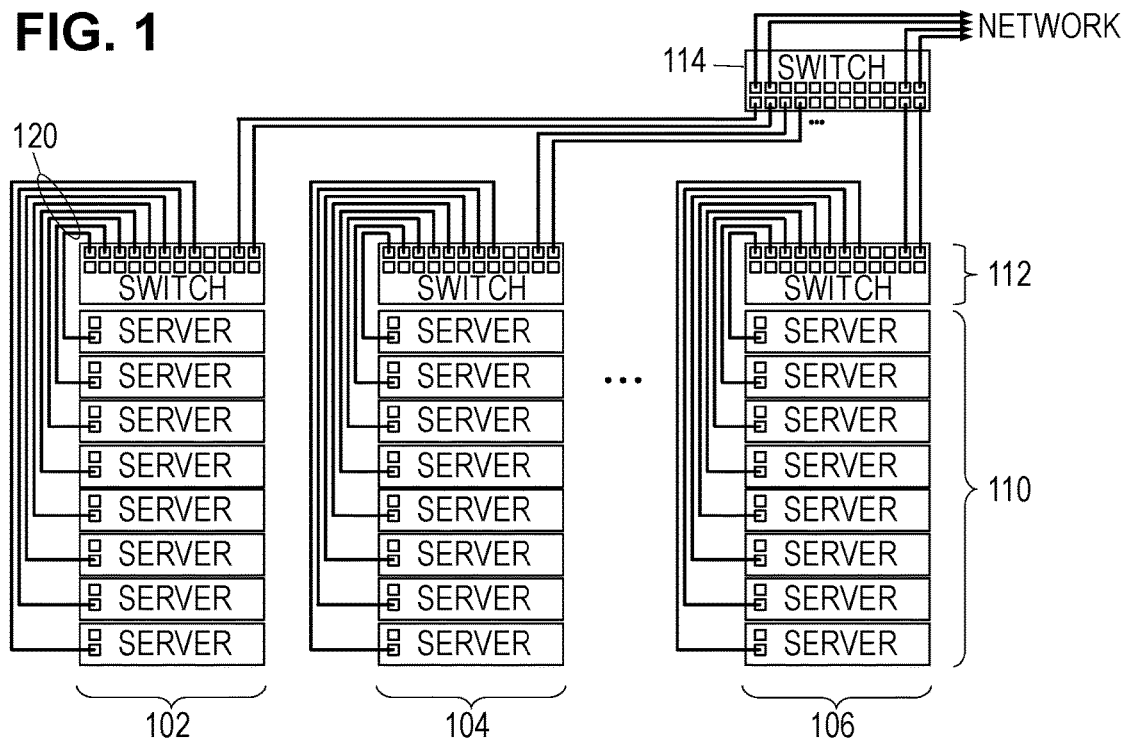
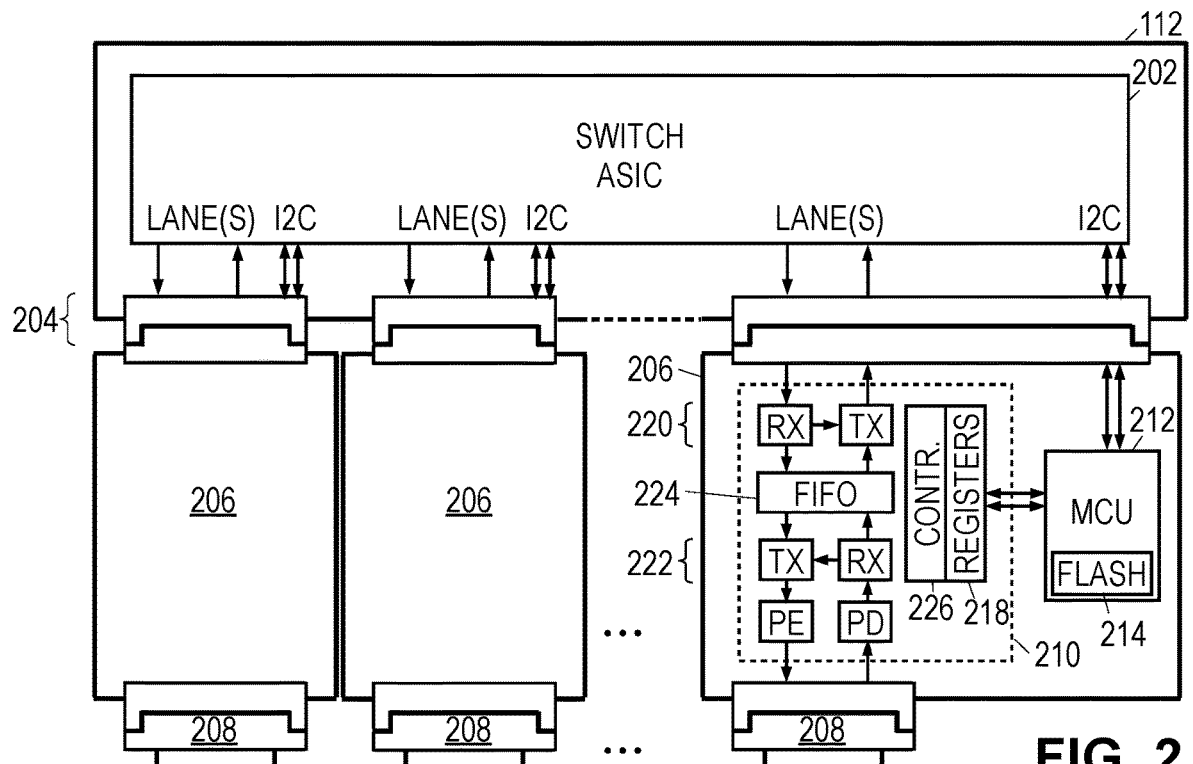
FIG. 2

RECEIVER USING PSEUDO PARTIAL RESPONSE MAXIMUM LIKELIHOOD SEQUENCE DETECTION

RELATED APPLICATIONS

The present application relates to U.S. patent application Ser. No. 17/656,751, filed 2022 Mar. 28 by inventors Yu Liao and Junqing Sun, titled "Reduced-Complexity Maximum Likelihood Sequence Detector Suitable for M-ary Signaling", and hereby incorporated herein by reference in its entirety.

TECHNICAL FIELD

The present disclosure relates to digital communications receivers and, more particularly, to equalizers suitable for use with high-rate signaling and larger signal constellations.

BACKGROUND

Most integrated circuit devices have become so complex that it is impractical for electronic device designers to design them from scratch. Instead, electronic device designers rely on predefined modular units of integrated circuit layout designs, arranging and joining them as needed to implement the various functions of the desired device. Each modular unit has a defined interface and behavior that has been verified by its creator. Though each modular unit may take a lot of time and investment to create, its availability for re-use and further development cuts product cycle times dramatically and enables better products. The predefined units can be organized hierarchically, with a given unit incorporating one or more lower-level units and in turn being incorporated within higher-level units. Many organizations have libraries of such predefined modular units for sale or license, including, e.g., embedded processors, memory, interfaces for different bus standards, power converters, frequency multipliers, sensor transducer interfaces, to name just a few. The predefined modular units are also known as cells, blocks, cores, and macros, terms which have different connotations and variations ("IP core", "soft macro") but are frequently employed interchangeably.

The modular units can be expressed in different ways, e.g., in the form of a hardware description language (HDL) file, or as a fully-routed design that could be directly printed to create a series of manufacturing process masks. Fully-routed design files are typically process-specific, meaning that additional design effort would usually be needed to migrate the modular unit to a different process or manufacturer. Modular units in HDL form require subsequent synthesis, placement, and routing steps for implementation, but are process-independent, meaning that different manufacturers can apply their preferred automated synthesis, placement, and routing processes to implement the units using a wide range of manufacturing processes. By virtue of their higher-level representation, HDL units may be more amenable to modification and the use of variable design parameters, whereas fully-routed units may offer better predictability in terms of areal requirements, reliability, and performance. While there is no fixed rule, digital module designs are more commonly specified in HDL form, while analog and mixed-signal units are more commonly specified as a lower-level, physical description.

Serializer-deserializer (SerDes) cores are a frequent need for device designs that employ modern data communications standards, which continue to evolve towards higher symbol rates and larger numbers of bits per channel symbol due to continuing demand for ever-lower latencies and ever-higher transfer rates. The channel symbols are attenuated and dispersed as they propagate, causing intersymbol interference (ISI) at the receiving end of the channel. For a given channel bandwidth, this ISI worsens at higher symbol rates and larger symbol constellations. When trying to detect the channel symbols, receivers must contend with this ISI in addition to the channel noise that contaminates the receive signal.

Due to their relatively low complexities, linear equalizers and decision feedback equalizers (DFE) are typically preferred for facilitating channel symbol detection without undue noise enhancement. Yet as data rates push ever closer to channel capacity, these equalizers may fail to provide sufficiently low error rates. The maximum likelihood sequence detector (MLSD) employs a symbol detection strategy that is optimal from an error rate perspective, but that is often prohibitive from a complexity and power consumption perspective when configured to detect multibit symbols.

SUMMARY

Accordingly, there are disclosed herein receivers and methods using maximum likelihood sequence detection with pseudo partial response equalization. One illustrative receiver includes: a feedforward equalizer that produces an equalized receive signal by diminishing a receive signal's intersymbol interference; a decision element that derives initial symbol decisions from samples of the equalized receive signal; and a filter that applies a partial response to the equalized receive signal or to an equalization error signal to produce input for a maximum likelihood sequence detector (MLSD).

An illustrative receive method includes: diminishing a receive signal's intersymbol interference to produce an equalized receive signal; deriving initial symbol decisions from samples of the equalized receive signal; and applying a partial response to the equalized receive signal or to an equalization error signal to produce input for a MLSD.

An illustrative semiconductor intellectual property core generates circuitry for implementing a receiver and/or receiving method as described above.

Each of the foregoing receiver, method, and core implementations may be embodied individually or conjointly and may be combined with any one or more of the following optional features: 1. a filter that converts the full-response errors into partial response errors. 2. a filter that converts the equalized receive signal into a partial response signal. 3. a circuit that uses the full-response errors to determine a competing symbol decision for each initial symbol decision. 4. the decision element determines a competing symbol decision for each initial symbol decision. 5. a reduced-complexity maximum likelihood sequence detector (rMLSD) that derives final symbol decisions by evaluating state metrics only for each initial symbol decision and its competing symbol decision. 6. the rMLSD includes calculation circuitry that combines the partial response errors with initial symbol decisions and with associated competing symbol decisions to determine corresponding branch metrics. 7. the rMLSD includes calculation circuitry that combines the partial response signal with initial symbol decisions and with associated competing symbol decisions to determine corresponding branch metrics. 8. the calculation circuitry sums each branch metric with an associated state metric to obtain path metrics. 9. the rMLSD includes:

comparators that determine a minimum path metric for each initial symbol decision and each competing symbol decision; and a pair of copy-shift registers that respond to outputs of the comparators to assemble a most likely symbol decision sequence ending in that symbol decision and that competing symbol decision. 10. an element that determines a sign of an equalization error between each sample of the equalized receive signal and a level of a corresponding initial symbol decision; and a circuit that uses the sign to determine a competing symbol decision for each initial symbol decision.

BRIEF DESCRIPTION OF THE DRAWINGS

FIG. 1 shows an illustrative network.
FIG. 2 is a block diagram of an illustrative switch.

DETAILED DESCRIPTION

Figure 3:
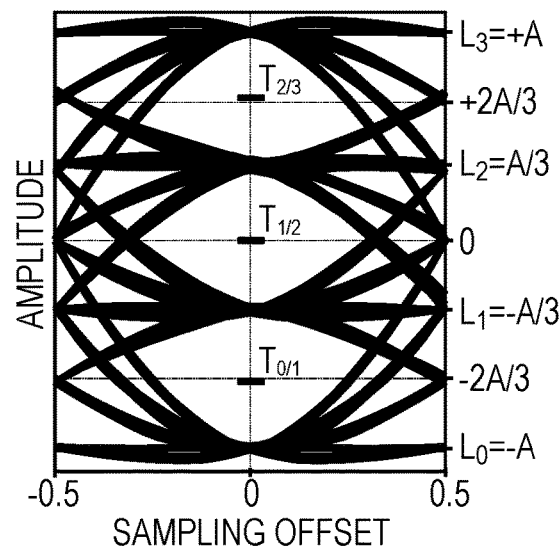
FIG. 3 is an illustrative PAM4 eye diagram.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

For context, FIG. 1 shows an illustrative network such as might be found in a data processing center, with multiple server racks 102-106 each containing multiple servers 110 and at least one "top of rack" (TOR) switch 112. The TOR switches 112 are connected to aggregator switches 114 for interconnectivity and connection to the regional network and internet. (As used herein, the term "switch" includes not just traditional network switches, but also routers, network bridges, hubs, and other devices that forward network communication packets between ports.) Each of the servers 110 is connected to the TOR switches 112 by network cables 120, which may convey signals with symbol rates high enough to motivate the use of maximum likelihood sequence detectors (M LSD).

FIG. 2 shows an illustrative switch 112 with an application-specific integrated circuit (ASIC) 202 that implements packet-switching functionality coupled to port connectors 204 for pluggable modules 206. Pluggable modules 206 couple between the port connectors 204 and cable connectors 208 to improve communications performance by way of equalization and optional format conversion (e.g., converting between electrical and optical signals). The pluggable modules 206 may comply with any one of various pluggable module standards including SFP, SFP-DD, QSFP, QSFP-DD, and OSFP. Alternatively, the cables themselves may have connectors that conform to the pluggable module standards and incorporate the pluggable module circuitry.

The pluggable modules 206 may each include a retimer chip 210 and a microcontroller chip 212 that controls operation of the retimer chip 210 in accordance with firmware and parameters that may be stored in nonvolatile memory 214. The operating mode and parameters of the pluggable retimer modules 206 may be set via a two wire bus such as I2C or MDIO that connects the microcontroller chip 212 to the host device (e.g., switch 112). The microcontroller chip 212 responds to queries and commands received via the two wire bus, and responsively retrieves information from and saves information to control registers 218 of the retimer chip 210.

Retimer chip 210 includes a host-side transceiver 220 coupled to a line-side transceiver 222 by first-in first-out (FIFO) buffers 224. FIG. 2 shows optional photoemitter (PE) and photodetector (PD) modules to convert between optical line-side signals and electrical host-side signals. Though only a single lane is shown in the figure, the transceivers may support multiple lanes conveyed via multiple corresponding optical fibers or electrical conductors. A controller 226 coordinates the operation of the transceivers in accordance with the control register contents, and may provide for multiple communication phases pursuant to a communications standard such as the Fibre Channel Standard published by the American National Standard for Information Technology Accredited Standards Committee INCITS, which provides phases for link speed negotiation (LSN), equalizer training, and normal operation.

FIG. 3 is an illustrative PAM4 eye diagram with three decision thresholds $T_{0/1}$, $T_{1/2}$, $T_{2/3}$, to distinguish between the four potential symbols 0, 1, 2, 3, having respective target levels $L_0=-A$, $L_1=-A/3$, $L_2=A/3$, and $L_3=A$. The decision thresholds are nominally set at 0 and $\pm 2A/3$. Noise, interference, and other channel effects cause variation in the signal, spreading the signal paths and reducing the size of the eyes, thereby increasing the probability of symbol detection error.

Figure 4:
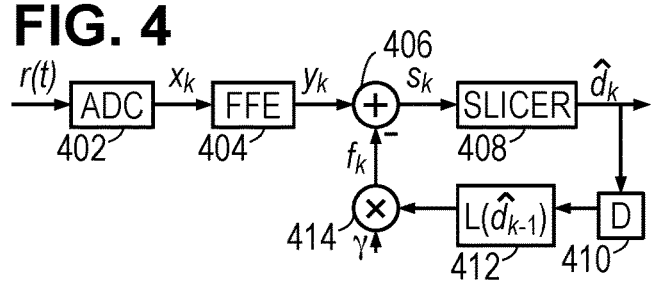
FIG. 4 is a block diagram of a one-tap DFE.

FIG. 4 shows a one-tap DFE. An analog to digital converter (ADC) 402 converts an analog receive signal r(t) to a digital receive signal $x_k$, which may be filtered by a forward equalizer (FFE) 404 to produce a filtered receive signal $y_k$ having minimal leading intersymbol interference (ISI). The FFE 404 can further shape the signal spectrum to limit trailing ISI to one symbol. That is, the filtered receive signal can be expressed:

$$y_k = L(d_k) + \gamma_L(d_{k-1}) + n_k, \quad (1)$$

where $d_k \in \{0,1,2,3\}$ represents the transmitted PAM4 symbols, $L(d_k)$ is a mapping of PAM4 symbols to their corresponding signal levels, and n k represents the noise plus some other impairments.

A summer 406 combines the filtered receive signal with a feedback signal $f_k$ to produce an equalized signal $s_k$ having reduced trailing ISI and thus (in the absence of significant channel noise) having open decision eyes such as those of FIG. 3. A slicer 408 compares the equalized signal to the decision thresholds to determine the symbol decisions $\hat{d}_k$. A delay element 410 latches the symbol decision $\hat{d}_k$ for one symbol interval, making it available during the next symbol interval as the preceding symbol decision $\hat{d}_{k-1}$. A symbol mapper 412 converts the symbol to its target level $L_{\hat{d}_{k-1}}$. A multiplier 414 scales the symbol mapper output by a feedback filter coefficient γ to produce the feedback signal $f_k$ for summer 406.

Figure 5:
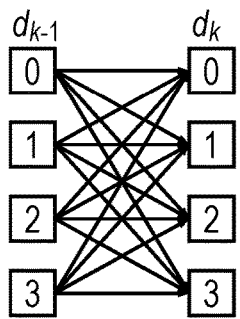
FIG. 5 is a schematic of one Viterbi trellis stage for PAM4.

Instead of a DFE, a conventional MLSD could be applied to the filtered receive signal $y_k$. With the trailing ISI limited to one PAM4 symbol interval, the conventional MLSD would employ a four state trellis such as that shown in FIG. 5 to find the PAM4 sequence $\hat{d}=\{\hat{d}_0, \hat{d}_1, \ldots, \hat{d}_{n-1}\}$ that maximizes the likelihood $Pr\{Y|\hat{d}\}$, for the sequence of FFE outputs $Y=\{y_0, y_1, \ldots, y_{n-1}\}$.

Each stage of the trellis has 4 states, $s_j^k$, $0 \leq j < 4$, representing 4 possible PAM4 symbols of the kth symbol interval. There are 16 possible transitions from previous symbol $d_{k-1}$ to current symbol $d_k$; each transition has a branch metric $b_{i,j}^k$ associated with it, where indices $0 \leq i < 4$ and $0 \leq j < 4$ represent the 4 possible PAM4 symbols of the previous and current symbol intervals, respectively. The branch metric is computed as follows:

$$b_{i,j}^k = (y_k - L(j) - \gamma L(i))^2 \tag{2}$$

Each state has an associated state metric $c_j^k$ representing the accumulated branch metrics of the maximum likelihood path from start to the state of $s_j^k$. The state metrics are computed as follows:

$$c_j^k = \min_{0 \leq i < 4} \left( c_i^{k-1} + b_{i,j}^k \right) \tag{3}$$

Based on above equations, the MLSD finds the maximum likelihood path from the beginning to the end of the sequence, and the maximum likelihood decision sequence is the decision sequence associated with the branches that constitutes the maximum likelihood path.

The conventional MLSD for PAM4 with one symbol interval of trailing ISI requires sixteen branch metric computation units and four 4-way Add Compare Select (ACS) units in the critical timing path for each symbol interval. For data center applications, the power consumption of such components would be prohibitively high at data rates beyond 50 Gbaud.

To implement a reduced-complexity MLSD (rMLSD), we now introduce the concept of a "competing decision". Where the DFE's symbol decision $\hat{d}_k$ is the most likely transmitted symbol for a given $y_k$ and $\hat{d}_{k-1}$, the competing symbol decision $\hat{d}'_k$ is the second most likely transmitted symbol. Defining the equalization error signal $e_k$ as:

$$e_k = y_k - L(\hat{d}_k) - \gamma L(\hat{d}_{k-1}), \tag{4}$$

the competing symbol decision $\hat{d}'_k$ for PAM4 is:

| $\hat{d}_k$ | $e_k$ | $\hat{d}'_k$ |
|---|---|---|
| 0 | any | 1 |
| 1 | $e_k < 0$ | 0 |
| 1 | $e_k \geq 0$ | 2 |
| 2 | $e_k < 0$ | 1 |
| 2 | $e_k \geq 0$ | 3 |
| 3 | any | 2 |

We observe that under practical operating conditions, it is highly probable that the transmitted symbol $d_k$ is either equal to $\hat{d}_k$ or equal to $\hat{d}'_k$. Thus the MLSD trellis can be simplified to consider just these potential symbol decisions with minimal performance loss.

Mathematically speaking, let the sequence $d_v = \{d_{v,0}, d_{v,1}, \ldots, d_{v,n-1}\}$, where $d_{v,k} \in \{\hat{d}_k, \hat{d}'_k\}$, $0 \leq k < n$. The proposed low complexity MLSD finds the maximum likelihood sequence $d_v^{max}$ that satisfies the following:

$$d_v^{max} = \max_{d_v} Pr\{Y|d_v\} \tag{5}$$

Figure 6:
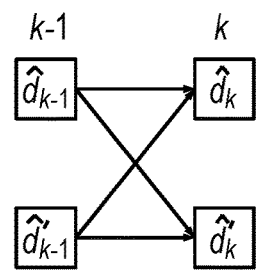
FIG. 6 is a schematic of an illustrative rMLSD trellis stage.

Now, let "0" represent the state that $d_{v,k} = \hat{d}_k$ and "1" the state that $d_{v,k} = \hat{d}'_k$. The proposed low complexity MLSD works on a 2-state trellis shown in FIG. 6. Each stage in the trellis has only 2 states $s_j^k$, $0 \leq j < 2$, and 4 branches with branch metrics $b_{i,j}^k$, $0 \leq i < 2$ and $0 \leq j < 2$. The branch metric is computed as:

$$b_{i,j}^k = (y_k - \hat{y}_k)^2, \tag{6}$$

where $\hat{y}_k$ is given as:

$$\hat{y}_k = \bar{j} * L(\hat{d}_k) + j * L(\hat{d}'_k) + \bar{i} * \gamma * L(\hat{d}_{k-1}) + i * \gamma * L(\hat{d}'_{k-1}) \tag{7}$$

In Equation (7), $\bar{i}$ and $\bar{j}$ are the complementary values of i and j, respectively. For example, if i=0, $\bar{i}$=1; if i=1, $\bar{i}$=0. Further simplification of the branch metric calculation can be achieved using the equalization error signal $e_k$ (or the pseudo-partial response error $e'_k$ introduced below):

$$b_{i,j}^k = (e'_k + j*(L(\hat{d}_k) - L(\hat{d}'_k)) + i*\gamma*(L(\hat{d}_{k-1}) - L(\hat{d}'_{k-1})))^2 \tag{8}$$

The state metric $c_j^k$, $0 \leq j < 2$, is computed as follows:

$$c_j^k = \min_{0 \leq i < 2} \left( c_i^{k-1} + b_{i,j}^k \right) \tag{9}$$

Each state has a path memory with predefined length to store the decisions of the branches that constitute the survivor path of the state that is the maximum likelihood path from trellis start to the current state. The decision of each branch is the same as the ending state of the branch. Compared to the conventional MLSD, where the decision of each branch has 2 bits, the decision of each branch in the proposed low complexity MLSD has only 1 bit. Unlike the conventional MLSD, which has a complexity that grows quadratically with the constellation size, the rMLSD need not have any complexity increase beyond what is needed by the DFE equalizer.

Figure 7:
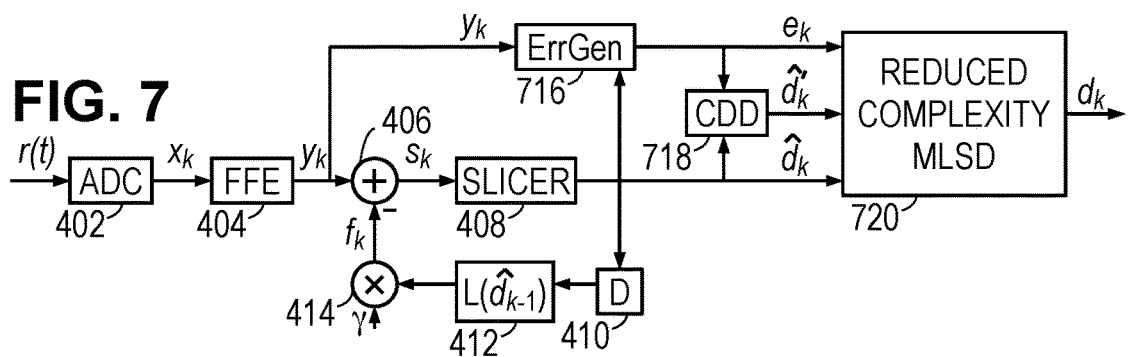
FIG. 7 is a block diagram of an illustrative rMSLD with an initial DFE stage.

FIG. 7 shows an illustrative receiver implementation with a decision feedback equalizer (DFE) and an rMLSD. The illustrated receiver includes an error calculation circuit 716 that calculates the equalization error $e_k$ as provided in equation (4), A competing decision determination (CDD) circuit 718 combines the equalization error with the corresponding initial symbol decision to determine the competing symbol decision $\hat{d}'_k$. A rMLSD 720 operates on the equalization error $e_k$, the initial symbol decisions $\hat{d}_k$, and the competing symbol decisions $\hat{d}'_k$, to derive a refined, or "final", sequence of symbol decisions $d_k$.

We note here that variations exist on this receiver implementation. As an alternative to having a CDD circuit 718, the slicer 408 can be modified to provide both the initial symbol decisions $\hat{d}_k$ and the competing symbol decisions $\hat{d}'_k$. The rMLSD can be configured to operate on the filtered receive signal $y_k$ in combination with the symbol decisions, rather than using the calculated equalization error $e_k$. These variations and others are discussed more fully in related application U.S. patent application Ser. No. 17/656,751 ("Reduced-Complexity Maximum Likelihood Sequence Detector Suitable for M-ary Signaling").

It should be noted that the rMLSD necessarily fails when $d_k \notin \{\hat{d}_k, \hat{d}'_k\}$. When the magnitude of the trailing ISI coefficient approaches or exceeds 1, the DFE becomes susceptible to error propagation, since the occurrence of a first symbol error causes improper calculation of the feedback signal and thereby substantially increases the likelihood of subsequent decision errors. The equalization error of equation (4) becomes large enough that the rMLSD's failure is almost assured.

Figure 8:
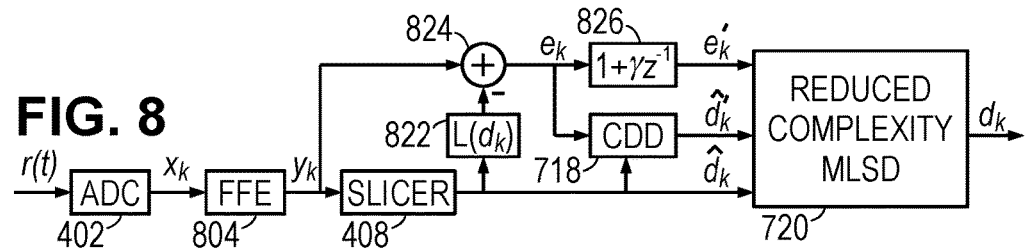
FIG. 8 is a block diagram of a first illustrative receiver employing a rMLSD with pseudo partial response equalization.

To address this potential issue, an alternative receiver implementation is illustrated in FIG. 8. Unlike the partial response equalizer 404 of the previous implementations, the FFE 804 is a full response equalizer diminishing the leading and trailing ISI to equalize the ADC output x k to $$y_k = L(d_k) + n_k \tag{10}$$

Decision element 408 compares the filtered receive signal to the previously-discussed thresholds to obtain the initial symbol decisions $\hat{d}_k$. A level circuit 822 maps the initial symbol decisions to their corresponding signal levels $L(d_k)$, which a difference element 824 then subtracts from the filtered receive signal to calculate the (full response) equalization error signal $e_k$:

$$e_k = y_k - L(\hat{d}_k). \tag{11}$$

A partial response filter 826 derives a pseudo-partial response error $e'_k$ given by $$e'_k = e_k + \gamma \cdot e_{k-1} \tag{12}$$

Figure 12:
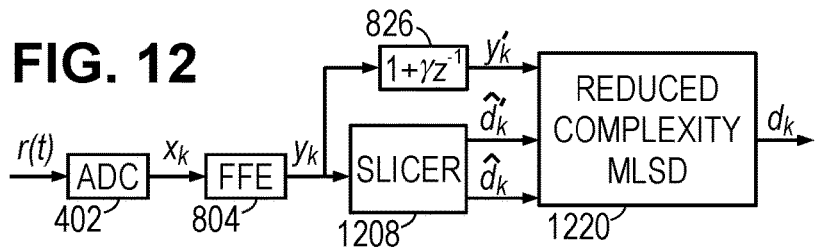
FIG. 12 is a block diagram of a second illustrative receiver employing a rMSLD with pseudo partial response equalization.

The partial response coefficient $\gamma$ can be programmable and/or dynamically adapted to minimize the error variance. The CDD circuit 718 and rMLSD 720 may be implemented as in the receiver of FIG. 7. And as shown in FIG. 12, the rMLSD can be alternatively configured to perform branch metric calculations of equation (6) using the pseudo partial response filtered receive signal $y'_k$ rather than the error signal $e_k$. Additional implementation detail for the branch metric calculations can be found in the related application.

In the following, we show that the full-response equalizer 804 and decision element 408 followed by a partial response filter 826 (applied to either the equalization error $e_k$ or to the filtered receive signal $y_k$) and MLSD is theoretically equivalent to a partial-response equalizer and decision element with MLSD. For the rMLSD, however, the implementation of FIG. 8 may be advantageous as explained further below.

Using equation (11), equation (12) can be rewritten as $$e'_k = y_k + \gamma \cdot y_{k-1} - [L(\hat{d}_k) + \gamma \cdot L(\hat{d}_{k-1})] \tag{13}$$

Combine the first two terms to represent a partial response filtered receive signal, and we have $$y'_k = y_k + \gamma \cdot y_{k-1} \tag{14}$$

$$e'_k = y'_k - [L(\hat{d}_k) + \gamma \cdot L(\hat{d}_{k-1})] \tag{15}$$

Substitute (10) into (14), we have $$y'_k = L(d_k) + \gamma \cdot L(d_{k-1}) + n_k + \gamma \cdot n_{k-1} \tag{16}$$

and combine the last two terms to represent the partial response filtered noise signal $$n'_k = n_k + \gamma \cdot n_{k-1} \tag{17}$$

In the following we show that $y'_k$ is equivalent to the $1+\gamma z^{-1}$ partial response equalization output and $n'_k$ is equivalent to the noise/distortion in the $1+\gamma z^{-1}$ partial response equalization output. Let $X(z)$ be the z-transform of the ADC output $x_k$, $D(z)$ the z-transform of transmitted symbols $L(d_k)$, $F(z)$ the transfer function of the full response equalizer, and $Y(z)$ the z-transform of the equalizer output. Then, we have the following:

$$Y(z) = X(z) \cdot F(z) \tag{18}$$

The z-transforms of (14) and (16) give $$Y'(z) = (1 + \gamma \cdot z^{-1}) \cdot Y(z) \tag{19}$$

$$Y'(z) = (1 + \gamma \cdot z^{-1}) \cdot D(z) + N'(z) \tag{20}$$

where $N'(z)$ is the z-transform of $n'_k$. Combining (18)-(20) yields $$(1 + \gamma \cdot z^{-1}) \cdot F(z) \cdot X(z) = Y'(z) \tag{21}$$

$$= (1 + \gamma \cdot z^{-1}) \cdot D(z) + N'(z)$$

Equation (21) shows that $(1+\gamma \cdot z^{-1}) \cdot F(z)$ is a partial response equalizer, $y'_k$ is the output of the partial response equalizer, and the noise/distortion n' k associated with the rMLSD input $e'_k$ is the noise/distortion in ADC samples shaped by the partial response equalizer 826. Thus the rMLSD in the pseudo-partial response maximum likelihood detector sees the same partial response equalized signal $y'_k$ and the same noise/distortion $n'_k$ as in the PRML detector, and the error signal $e'_k$ in (15) is an estimation of the partial response equalization error.

As previously noted, the 2-state MLSD fails if $d_k \notin \{\hat{d}_k, \hat{d}'_k\}$. Comparing the DFE equalization error in (4) and the full response equalization errors in (11), the notable difference is the trailing ISI term $\gamma \cdot L(\hat{d}_{k-1})$ in (4). Without this term, the probability that $d_k \notin \{\hat{d}_k, \hat{d}'_k\}$ for the full response equalization is much lower than it is for the DFE equalization, especially when the trailing ISI coefficient $\gamma$ is relatively large. For the full response equalization, the failure condition requires $|n_k| > 2$ assuming $L(d_k) \in \{\pm 1, \pm 3\}$, while for the DFE equalization, the failure condition for DFE equalization when $\hat{d}_{k-1} \neq d_{k-1}$ is only $|n_k + 2 \cdot \gamma| > 2$. Moreover, since there is no decision error propagations in the pseudo partial response equalizer of FIG. 8, the rMLSD does not need to handle the long decision burst errors that DFE is prone to causing. Moreover, the pseudo-PRML does not need DFE, which noticeably reduces implementation cost.

Figure 9:
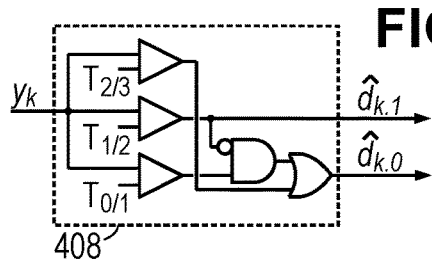
FIG. 9 is a schematic of an illustrative decision element.
Figure 10:
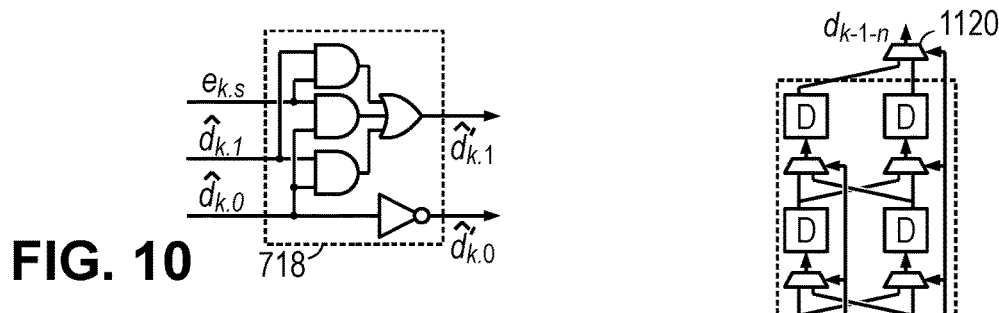
FIG. 10 is a schematic of an illustrative competing decision determination circuit.
Figure 11:
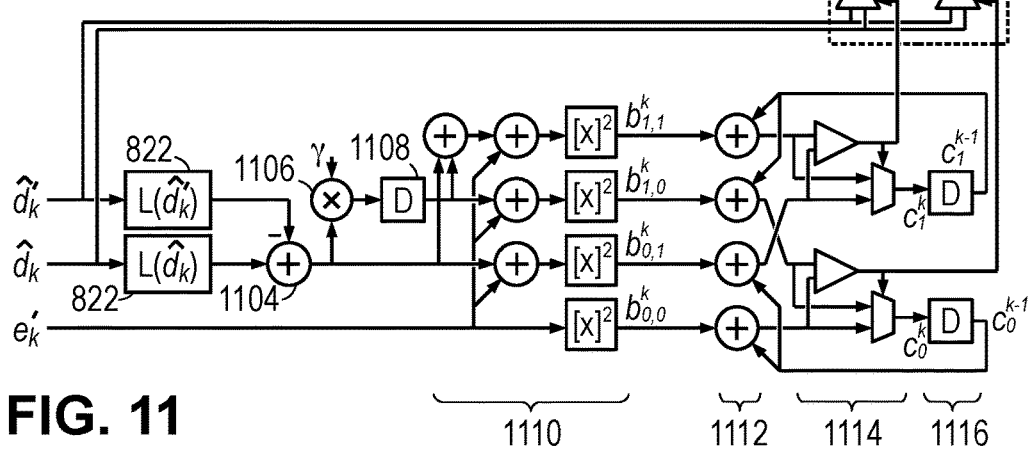
FIG. 11 is a schematic of an illustrative rMSLD.

Additional implementation detail for the decision element 408 is provided in FIG. 9. Slicer 408 includes a set of comparators that compare the equalized signal $s_k$ to decision thresholds $T_{0/1}$, $T_{1/2}$, $T_{2/3}$, yielding a set of comparator outputs that are readily converted by logic gates into two-bit binary representations of the initial symbol decision $\hat{d}_k$. FIG. 10 shows a CDD circuit 718 that takes the binary representation of the initial symbol decision $\hat{d}_k$ and combines it with the equalization error's sign bit using a set of logic gates to determine the competing symbol decision FIG. 11 shows an illustrative implementation of the rMLSD 720, which includes level circuits 822 for mapping the initial symbol decision and competing symbol decisions to their signal levels. A difference element subtracts the signal levels and supplies the difference to branch metric calculation circuitry 1110. A multiplier 1106 scales the difference by the partial response coefficient $\gamma$, supplying the scaled difference to a delay element 1108. Branch metric calculation circuitry 1110 combines the difference, the delayed scaled difference, and the error to obtain the branch metrics of equation (8). Adders 1112 combine the branch metrics with the previous state metrics $c_j^{k-1}$ to provide path metrics to the compare-select circuitry 1114. The compare-select circuitry includes comparators that compare the path metrics for each state and select the minimum to be the next state metric. Latches 1116 store the next state metric for use in the subsequent calculation.

The comparator results are provided to the copy-shift register 1118 to steer the initial and competitive symbol decisions through a series of latches in a manner that assembles most-probable symbol decision sequences for each trellis state. A final multiplexer 1120 selects the symbol decision from the front of the assembled sequence determined to be most probable.

Figure 13:
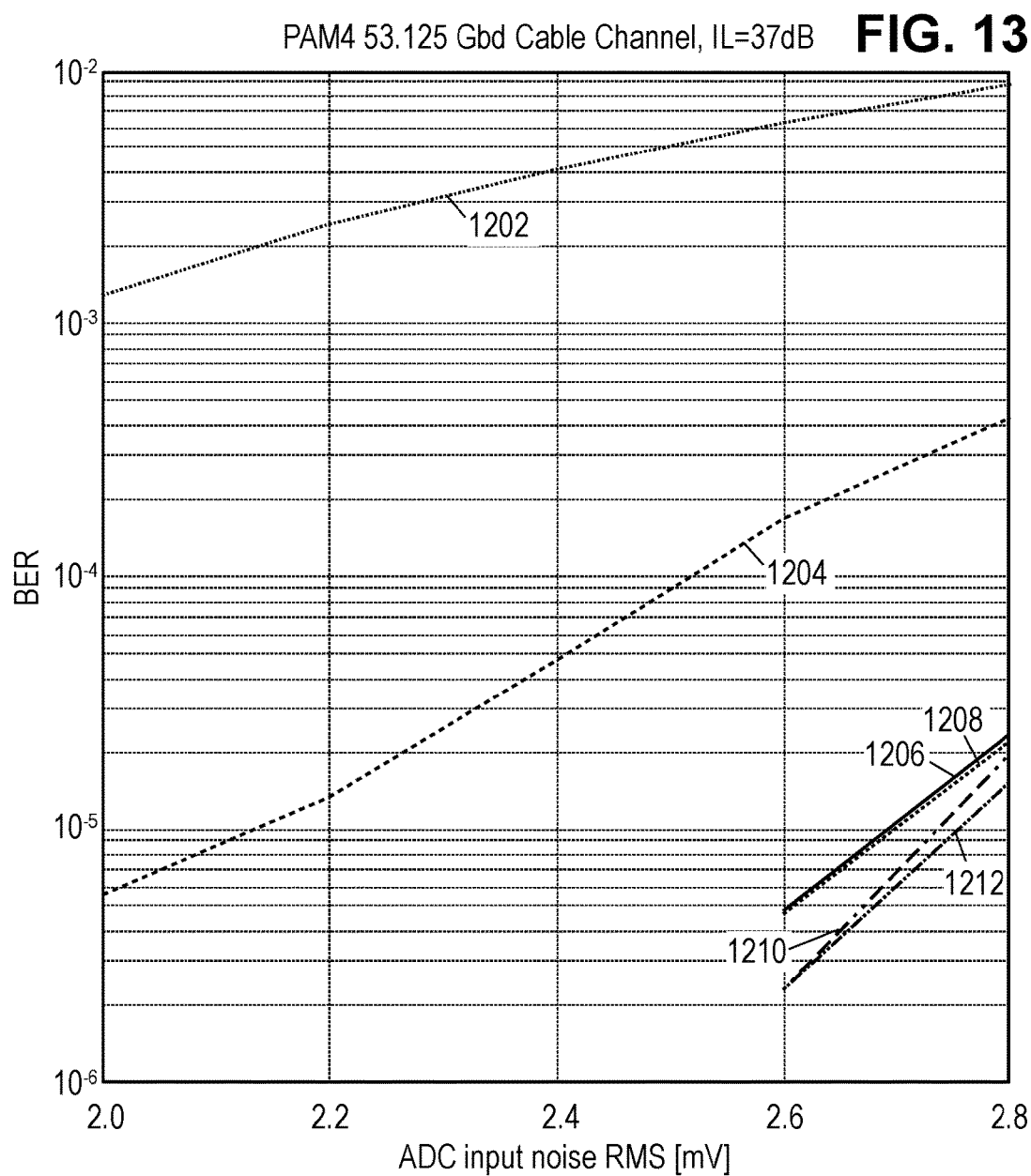
FIG. 13 is a graph comparing bit error rate for various equalizers.

Performance simulations were done over a channel with 37 dB insertion loss at the Nyquist frequency and the results are shown in FIG. 13. The evaluated detector configurations included the (full response) FFE alone (line 1202), DFE (1204), MLSD preceded by partial response FFE with $\gamma=1$ (1206), rMLSD with pseudo partial response with $\gamma=1$ (1208), MLSD preceded by partial response FFE with $\gamma=0.8$ (1210), and rMLSD with pseudo partial response with $\gamma=0.8$ (1212). The pseudo-PRML configuration performs as well as the full complexity MLSD receiver, and does so with substantially less complexity.

Lab data (FFE output) was also collected from the chip debug memory and processed offline in accordance with different detector configurations. Approximately 1.6e7 PRBS31 bits were transmitted through a channel having a 36.8 dB insertion loss from bump to bump. The evaluated configurations were the (full response) FFE (BER=3.56e-4), DEF with $\gamma=0.5$ (BER=1.43e-4), rMLSD preceded by DFE with $\gamma=0.5$ (BER=1.44e-5), and rMLSD with pseudo partial response with $\gamma=0.5$ (7.31e-6). In at least this case, the pseudo-PRMLSD outperforms the DFE-rMLSD configuration.

It is contemplated that the disclosed receiver implementation designs can be incorporated into SerDes cores for use by integrated circuit designers and manufacturers creating devices for a host of applications that might benefit from cost-, complexity-, and power-efficient high-bandwidth communications. Numerous alternative forms, equivalents, and modifications will become apparent to those skilled in the art once the above disclosure is fully appreciated. For example, the disclosed principles are applicable to both PAM, QAM, and PSK modulation, and to larger signal constellations including 8-PSK, 16-PAM, etc. Though one trailing ISI interval is described in the foregoing, the disclosed principles are also applicable to longer trailing ISI intervals albeit with an increased number of trellis states. It is intended that the claims be interpreted to embrace all such alternative forms, equivalents, and modifications that are encompassed in the scope of the appended claims.

What is claimed is:

1. A receiver comprising:
   a decision element that derives initial symbol decisions from samples of an equalized receive signal;
   a difference element that calculates a full-response error between each sample of the equalized receive signal and a level of a corresponding initial symbol decision;
   a filter that converts the full-response errors into partial response errors; and
   a reduced-complexity maximum likelihood sequence detector (rMLSD) that derives final symbol decisions by evaluating state metrics only for each initial symbol decision and its competing symbol decision, the rMLSD comprising:
      calculation circuitry that combines the partial response errors with initial symbol decisions and with associated competing symbol decisions to determine corresponding branch metrics, and that sums each branch metric with an associated state metric to obtain path metrics; and
      comparators that determine a minimum path metric for each initial symbol decision and each competing symbol decision.

2. The receiver of claim 1, wherein the equalized receive signal is produced by a feedforward equalizer that diminishes a receive signal's intersymbol interference.

3. The receiver of claim 1, further comprising: a circuit that uses the full-response errors to determine a competing symbol decision for each initial symbol decision.

4. The receiver of claim 1, wherein the decision element determines a competing symbol decision for each initial symbol decision.

5. The receiver of claim 1, wherein the rMLSD further comprises:
   a pair of copy-shift registers that respond to outputs of the comparators to assemble a most likely symbol decision sequence ending in that symbol decision and that competing symbol decision.

6. A receiver comprising:
   a feedforward equalizer that diminishes a receive signal's intersymbol interference to produce an equalized receive signal;
   a decision element that derives initial symbol decisions from samples of the equalized receive signal;
   a filter that converts the equalized receive signal into a partial response signal; and
   a reduced-complexity maximum likelihood sequence detector (rMLSD) that derives final symbol decisions by evaluating state metrics only for each initial symbol decision and its competing symbol decision, the rMLSD including:
      calculation circuitry that combines the partial response signal with initial symbol decisions and with associated competing symbol decisions to determine corresponding branch metrics, and that sums each branch metric with an associated state metric to obtain path metrics; and
      comparators that determine a minimum path metric for each initial symbol decision and each competing symbol decision.

7. The receiver of claim 6, further comprising:
   an element that determines a sign of an equalization error between each sample of the equalized receive signal and a level of a corresponding initial symbol decision; and
   a circuit that uses the sign to determine a competing symbol decision for each initial symbol decision.

8. The receiver of claim 6, wherein the decision element determines a competing symbol decision for each initial symbol decision.

9. The receiver of claim 6, wherein the rMLSD further includes:
   a pair of copy-shift registers that respond to outputs of the comparators to assemble a most likely symbol decision sequence ending in that symbol decision and that competing symbol decision.

10. A receiving method comprising:
    deriving initial symbol decisions from samples of an equalized receive signal;
    calculating a full-response error between each sample of the equalized receive signal and a level of a corresponding initial symbol decision;
    filtering the full-response errors to obtain partial response errors; and
    using a reduced-complexity maximum likelihood sequence detector (rMLSD) to determine final symbol decisions by evaluating state metrics only for each initial symbol decision and its competing symbol decision, wherein the rMLSD performs said determining by:
combining the partial response errors with initial symbol decisions and with associated competing symbol decisions to determine corresponding branch metrics;
summing each branch metric with an associated state metric to obtain path metrics; and
determining a minimum path metric for each initial symbol decision and each competing symbol decision.

11. The receiving method of claim 10, further comprising producing the equalized receive signal by diminishing intersymbol interference in a receive signal.

12. The receiving method of claim 10, further comprising: using the full-response errors to determine a competing symbol decision for each initial symbol decision.

13. The receiving method of claim 10, wherein said deriving includes determining a competing symbol decision for each initial symbol decision.

14. The receiving method of claim 10, wherein the rMLSD further performs said determining by:
assembling a most likely sequence of symbol decisions that ends with that initial symbol decision; and
assembling another most likely sequence of symbol decisions that ends with that competing symbol decision.

15. A receiving method comprising:
diminishing a receive signal's intersymbol interference to produce an equalized receive signal;
deriving initial symbol decisions from samples of the equalized receive signal;
filtering the equalized receive signal to obtain a partial response signal; and
using a reduced-complexity maximum likelihood sequence detector (rMLSD) to determine final symbol decisions by evaluating state metrics only for each initial symbol decision and its competing symbol decision, wherein the rMLSD performs said determining by:
combining the partial response signal with initial symbol decisions and with associated competing symbol decisions to determine corresponding branch metrics;
summing each branch metric with an associated state metric to obtain path metrics; and
determining a minimum path metric for each initial symbol decision and each competing symbol decision.

16. The receiving method of claim 15, further comprising:
determining a sign of an equalization error between each sample of the equalized receive signal and a level of a corresponding initial symbol decision; and
combining each sign with the corresponding initial symbol decision to determine a competing symbol decision.

17. The receiving method of claim 15, wherein said deriving includes determining a competing symbol decision for each initial symbol decision.

18. The receiving method of claim 15, wherein the rMLSD further performs said determining by:
assembling a most likely sequence of symbol decisions that ends with that initial symbol decision; and
assembling another most likely sequence of symbol decisions that ends with that competing symbol decision.

19. A semiconductor intellectual property core that generates circuitry comprising:
a feedforward equalizer that diminishes a receive signal's intersymbol interference to produce an equalized receive signal;
a decision element that derives initial symbol decisions from samples of the equalized receive signal, each initial symbol decision having a competing symbol decision;
a filter that applies a partial response to the equalized receive signal or to an equalization error signal to produce a filter output; and
a reduced-complexity maximum likelihood sequence detector (rMLSD) that derives final symbol decisions by evaluating state metrics only for each initial symbol decision and its competing symbol decision, the rMLSD including:
calculation circuitry that combines the filter output with initial symbol decisions and with associated competing symbol decisions to determine corresponding branch metrics, and that sums each branch metric with an associated state metric to obtain path metrics;
comparators that determine a minimum path metric for each initial symbol decision and each competing symbol decision; and
a pair of copy-shift registers that respond to outputs of the comparators to assemble a pair of most likely symbol decision sequences ending in each symbol decision and its competing symbol decision.

* * * * *